United States Patent [19]

Sakai

[11] Patent Number: 4,772,529
[45] Date of Patent: Sep. 20, 1988

[54] METHOD AND PRODUCT FOR PHOTOSENSITIVE AND PRESSURE-SENSITIVE RECORDING

[75] Inventor: Jun Sakai, Nagoya, Japan

[73] Assignee: Brother Kogyo Kabushiki Kaisha, Nagoya, Japan

[21] Appl. No.: 32,173

[22] Filed: Mar. 30, 1987

[30] Foreign Application Priority Data

Apr. 4, 1986 [JP] Japan .................................. 61-78901

[51] Int. Cl.$^4$ ........................... G03C 1/40; G03C 1/00
[52] U.S. Cl. ..................................... 430/138; 430/211; 430/235; 430/374; 430/541; 430/962
[58] Field of Search ............... 430/138, 211, 235, 962, 430/374, 541

[56] References Cited

U.S. PATENT DOCUMENTS 4,399,209 8/1983 Sanders et al. ....................... 430/138
4,416,966 11/1983 Sanders et al. .................. 430/211 X Primary Examiner—Mukund J. Shah
Attorney, Agent, or Firm—Kane, Dalsimer, Sullivan, Kurucz, Levy, Eisle and Richard

[57] ABSTRACT

A photosensitive and pressure-sensitive recording sheet and a process for recording an image using such recording sheet, said recording sheet comprising microcapsules, which enclose a first component, held on one side surface of a sheet and a second component, which causes color change of the surface of sheet when it reacts with the first component that is held on said one side surface of the sheet, held on the opposing side surface of the sheet and, moreover, one other component, which causes a change in the mechanical breaking strength of the microcapsule in response to exposure to light, enclosed in the microcapsules; and said process comprising exposing said one side surface of the sheet holding the microcapsules to a light, putting the so exposed surface of the sheet together with the surface, which holds the second component, of another recording sheet of the same construction and pressing the so laminated two sheets with each other.

2 Claims, 2 Drawing Sheets

METHOD AND PRODUCT FOR PHOTOSENSITIVE AND PRESSURE-SENSITIVE RECORDING

BACKGROUND OF THE INVENTION

1. Field of the Invention

The present invention relates to a separate-type photosensitive and pressure-sensitive recording sheet and, more particularly, to a recording sheet comprising microcapsules, which enclose a first component, held on one side surface of a sheet and a second component, which causes color change of the surface of sheet when it reacts with the first component that is held on said one side surface of the sheet, held on the opposing side surface of the sheet and, moreover, one other component, which causes a change in the mechanical breaking strength of the microcapsule in response to exposure to light, enclosed in the microcapsules.

2. Description of the Prior Art

Heretofore, there are photosensitive and pressure-sensitive materials in which photo-recording is achieved in such a manner, that an exposing sheet is photo-sensitized first by exposing it to an image of light and this sensitized exposing hseet is then laminated tightly with a developing sheet and the so laminated sheets are pressed with each other (see for example, U.S. Pat. No. 4,399,209). These recording materials require thus two separate sheets, namely, the exposing sheet and the developing sheet for recording a picture.

BRIEF SUMMARY OF THE INVENTION

The object of the present invention is to remove such shortcoming by employing the following measure.

The essential feature of the present invention is to provide a recording sheet comprising microcapsules, which enclose a first component, held on one side surface of a sh eet and a second component, which causes color change of the surface of sheet when it reacts with the first component that is held on said one side surface of the sheet, held on the opposing side surface of the sheet and, moreover, one other component, which causes a change in the mechanical breaking strength of the microcapsule in response to exposure in light, enclosed in the microcapsules.

The present invention relates also to a process for recording an image on a photosensitive and pressure-sensitive recording sheet holding, on one face thereof, microcapsules enclosing a first component and a component which causes a change in the mechanical breaking strength of the microcapsule in response to exposure to light and, on the other face thereof, a second component which causes color change of the surface of sheet when it reacts with the first component, comprising exposing said one fce of the sheet holding the microcapusles to a light, putting the so exposed sheet face together with the face holding the second component of another recording sheet of the same construction and pressing the so laminated two sheets with each other.

DETAILED DESCRIPTION OF THE INVENTION

The recording sheet according to the invention comprises microcapsules, which enclose therein the first component and are held on one side surface of a sheet and the second component, which causes color change of the surface of the sheet upon reaction with the first component and is held on the other side surface of the sheet, and further the third component, which provides a change of the mechanical breaking strength of the microcapsules in response to a light exposure and is enclosed in the microcapsules. The microcapsules held on one face of the recording sheet change their mechanical breaking strength only in the portions exposed to light, that is, the microcapsules exposed to light either increase or decrease their mechanical breaking strength from that of unexposed ones. The surface holding the microcapsules, of a light-exposed sheet and the surface holding the second component, of another recording sheet, which may have been exposed to light, are put together and pressed with each other by press rollers capable of imparting a sufficient squeezing force to destroy microcapsules. The weaker ones among these microcapsules are thereby crushed and the first component contained in the microcapsules as liquid phase leaks out and reacts with the second component on the other recording sheet, whereby a color change, for example, a desired color development is effected and, as a result, the image corresponding to the exposed picture of the original is developed on the surface of the second component layer of said another recording sheet.

DETAILED DESCRIPTION OF PREFERRED EMBODIMENTS

In the following, the present invention is described by way of examples. However, the present invention should not be restricted by the specific examples disclosed. The present invention encompasses quite many possible embodiments within the scope of the invention without departing from the gist of the invention.

Figure 1:
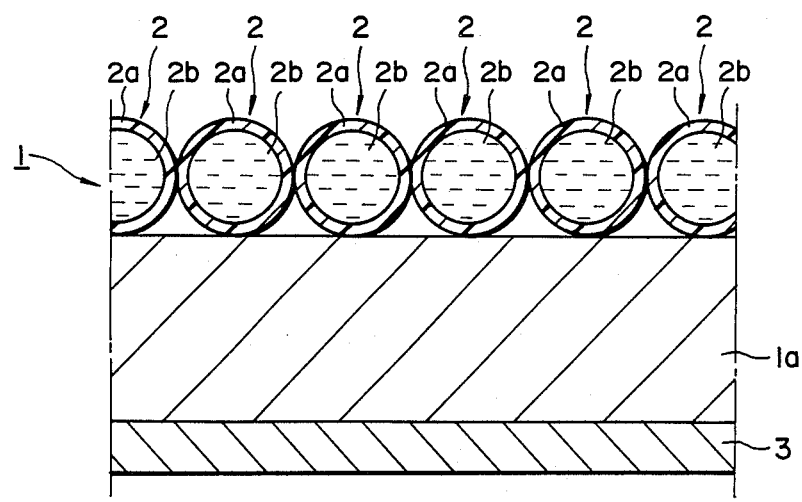
FIG. 1 is a partly enlarged cross-sectional view of an embodiment of the recording sheet according to the present invention.

FIG. 1 illustrates schematically an embodiment of the recording sheet according to the present invention in an enlarged sectional view. The sheet 1a made of paper holds a layer containing microcapsules 2 on its one face and a layer 3 containing a color developing agent on the opposing face. The microcapsule 2 consists of a shell 2a and a liquid phase 2b. The liquid phase includes a precursor of dyestuff, which develops a color by reacting with color developing agent 3 coated on the opposing face of another recording sheet, and a photo-hardening substance which will cause hardening of the liquid phase in response to exposure to light.

As the dyestuff precursor, triarylmethanes, bisphenylmethanes, xanthenes, thiazines, spiropyrans and mixtures of these may be used.

The color developing agent serves for developing the color, for which clay minerals, organic acids, acidic polymers, metal salts and aromatic carboxylic acids as well as mixtures of them may be employed. Photopolymerizable monomers, for example, acryloyl-containing compounds, such as, trimethylpropane triacrylate and so on, are used for the photo-hardening substance. The photo-hardening substance is used in combination with a photo polymerization initiator.

The photo polymerization initiator initiates polymerization of the monomers in response to irradiation of light. As the photo polymerization initiator, there may be enumerated substances capable of being sensitized by ultraviolet rays, for example, benzophenone, benzoyl alkyl ethers, such as, isopropyl ether etc., Michler's ketone, 2,3-diethyl thioxanthone etc., and substances capable of being sensitized by infrared rays, for example, organic and inorganic peroxides, such as, diacyl peroxides, ketone peroxides, alkyl peroxides, alkyl hydroperoxides, sulfonyl peroxides, peroxydicarbonates and so on.

These microcapsules enclosing the dyestuff precursor and the photo-hardening substance can be produced by well known techniques, such as, coacervation, interfacial polymerization and so on.

The microcapsules 2 are mixed with binder, filler, viscosity regulator etc. and the so prepared mixture is coated on the sheet 1a using a coating roller, a doctor or the like or by spraying.

The recording sheet 1 which has been prepared as above can be used now for reproducing a picture. Explaining the manner of reproduction of picture with reference to FIG. 2, the sheet 1 is first exposed to an ultraviolet ray emitted from an electric discharge tube 12 through an original. The liquid phase enclosed in the microcapsules 2 existing on the recording sheet 1 in the areas other than the portions 10a where the ultraviolet ray does not penetrate becomes hardened by the polymerization caused by the ultraviolet ray passed therethrough.

Figure 2:
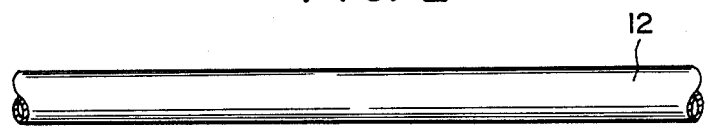
FIG. 2 is an explanatory illustration explaining the photorecording procedures with the sheet of FIG. 1.
Figure 2:
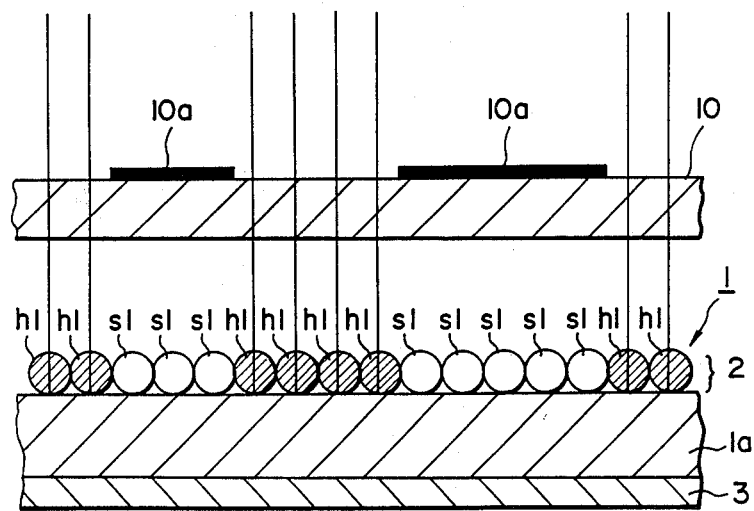
Figure 3:
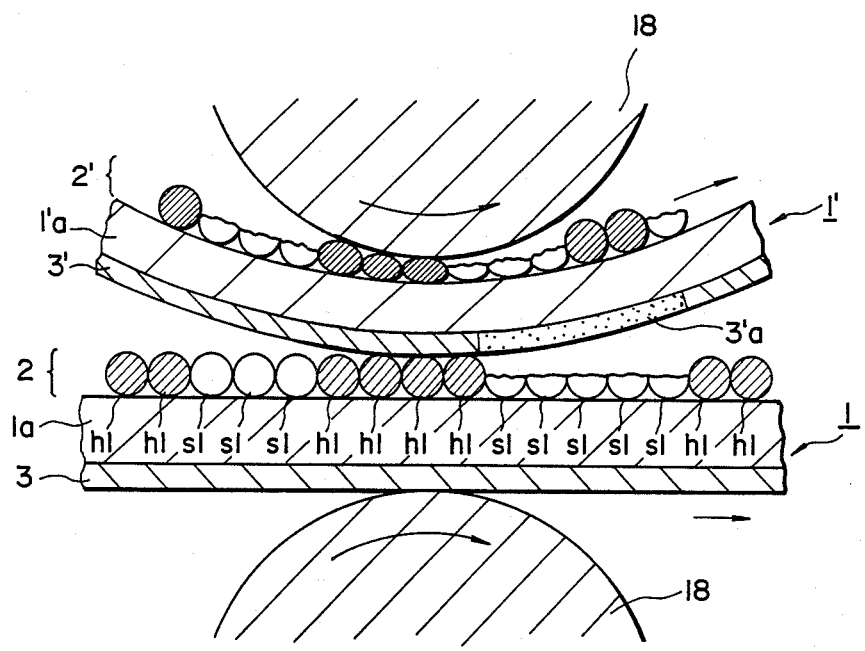
FIG. 3 is an explanatory illustration explaining the manner of crushing of microcapsules on the sheet.

In FIG. 2, it is shown that, among the microcapsules 2, unexposed ones s1 are not hardened, while the microcapsules h1 exposed to the light are hardened.

The recording sheet 1 which has been exposed to the image of the light and thus has its microcapsules hardened in the light-exposed portions is then put together with a recording sheet 1' which had been subjected to press squashing of the microcapsules existing thereon. Both the sheets are squeezed between a pair of press rollers 18 so as to crush the microcapsules remaining unhardened due to lack of light irradiation by shading. The hardened microcapsules withstand to the squeezing pressure, whereas the unhardened microcapsules are crushed and the internal liquid phase containing the dyestuff precursor capable of reacting with the color developing agent leaks out. By the reaction of the dyestuff precursor with the color developer 3', the color develops in the portions 3'a on the recording sheet 1' corresponding to the portions of the sheet 1 where the sheet is not irradiated by the light and, thus, the picture of the original 10 appears on the surface of the recording sheet 1'.

The recording sheet 1 which has been treated as above can be used for the recording sheet 1 on the next recording process.

In the above embodiment, color development is attained by the reaction between the dyestuff precursor and the color developer. It is however possible also, that the first component contained the liquid phase of the microcapsules is a decolorizing agent, such as, desensitizer functioning to keep the color developer to be isolated from the dyestuff precursor, a bleaching agent having a redox-activity and so on, and the second component is a dyestuff subject to decolorizing by the first component. In this case, the picture of the original is obtained by a change in hue, lightness or saturation caused by the decolorization.

As the present invention consists in using the recording sheet which has been used as the developing sheet, the recording of picture is attained using one and the same sort of recording sheet and contributes thus to saving of material due to the reuse of exposed sheets which have heretofore been discarded without use.

What is claimed is:

1. A photosensitive and pressure sensitive recording sheet having a first face and a second face opposite to said first face;

said first face having thereon microcapsules enveloping a first reaction component for an image developing reaction and a component which causes an alteration in the mechanical breaking strength of the microcapsules in response to exposure to light; and, said second face having thereon a second reaction component for said developing reaction which causes a change in color of one of said faces in locations where said second reaction component comes in contact with and reacts with said first reaction component.

2. A process for recording images on a photosensitive and pressure sensitive recording sheets each having a first face and a second face opposite to said first face;

said first face having thereon microcapsules enveloping a first reaction component for an image developing reaction and a component which causes an alteration in the mechanical breaking strength of the microcapsules in response to exposure to light; and, said second face having thereon a second reaction component for said developing reaction which causes a change in color of one of said faces in locations where said second reaction component comes in contact with and reacts with said first reaction component, said process comprising:

exposing said first face of a first recording sheet to light;

placing the thus exposed first face of said first sheet against a second face of a second recording sheet;

pressing said first and second recording sheets against each other whereby to break certain of the microcapsules of said first face of said first recording sheet to thereby bring about a developing reaction in locations where said second reaction component comes in contact with and reacts with said first reaction component.

* * * * *